United States Patent [19]

Nozaki et al.

[11] 4,282,270
[45] Aug. 4, 1981

[54] METHOD FOR FORMING AN INSULATING FILM LAYER OF SILICON OXYNITRIDE ON A SEMICONDUCTOR SUBSTRATE SURFACE

[75] Inventors: Takao Nozaki, Yokohama; Takashi Ito, Kawasaki, both of Japan

[73] Assignee: Fujitsu Limited, Kanagawa, Japan

[21] Appl. No.: 84,570

[22] Filed: Oct. 15, 1979

[30] Foreign Application Priority Data

Oct. 27, 1978 [JP] Japan .................. 53/132310

[51] Int. Cl.³ .................. H01L 21/316; H01L 21/318
[52] U.S. Cl. .................. 427/93; 427/94; 427/255; 427/255.3; 427/255.4
[58] Field of Search .................. 427/94, 93, 255, 255.3, 427/255.4

[56] References Cited

U.S. PATENT DOCUMENTS

| | | | |
|---|---|---|---|
| 3,558,348 | 1/1971 | Rand | 427/94 |
| 3,765,935 | 10/1973 | Rand et al. | 427/94 |
| 4,051,273 | 9/1977 | Abbas et al. | 427/94 |
| 4,097,889 | 6/1978 | Kern et al. | 427/94 |

FOREIGN PATENT DOCUMENTS 1130138 10/1968 United Kingdom .................. 427/94

OTHER PUBLICATIONS

Poponiak et al., "Formation of Thick $Si_3N_4$ or $Si_xO_yN_2$ on Si Substrate by Anodinitridization", IBMTDB 19(3), 905, 1976.

Chu et al., "Films of Silicon Nitride-Silicon Dioxide Mixtures", J. Electrochem. Soc: Solid State Science, 115(3), 318–322, (1968).

Brown et al., "Properties of $Si_xO_yN_2$ Films on Si", J. Electrochem. Soc: Solid State Science, 115(3), 311–317, (1968).

*Primary Examiner*—John D. Smith
*Attorney, Agent, or Firm*—Staas & Halsey

[57] ABSTRACT

An insulating film layer consisting of silicon oxynitride is formed on a silicon semiconductor substrate surface by bringing a surface of a silicon substrate into contact with an ammonia gas atmosphere containing a gas comprising containing substance gas, for example, oxygen gas, carbon dioxide gas, carbon monoxide gas, nitrogen monoxide gas, nitrogen dioxide gas, or water vapor, in a volume concentration of from $10^2$ to $10^4$ ppm in terms of molecular oxygen, at an elevated temperature, for example, of from 900° to 1300° C.

13 Claims, 4 Drawing Figures

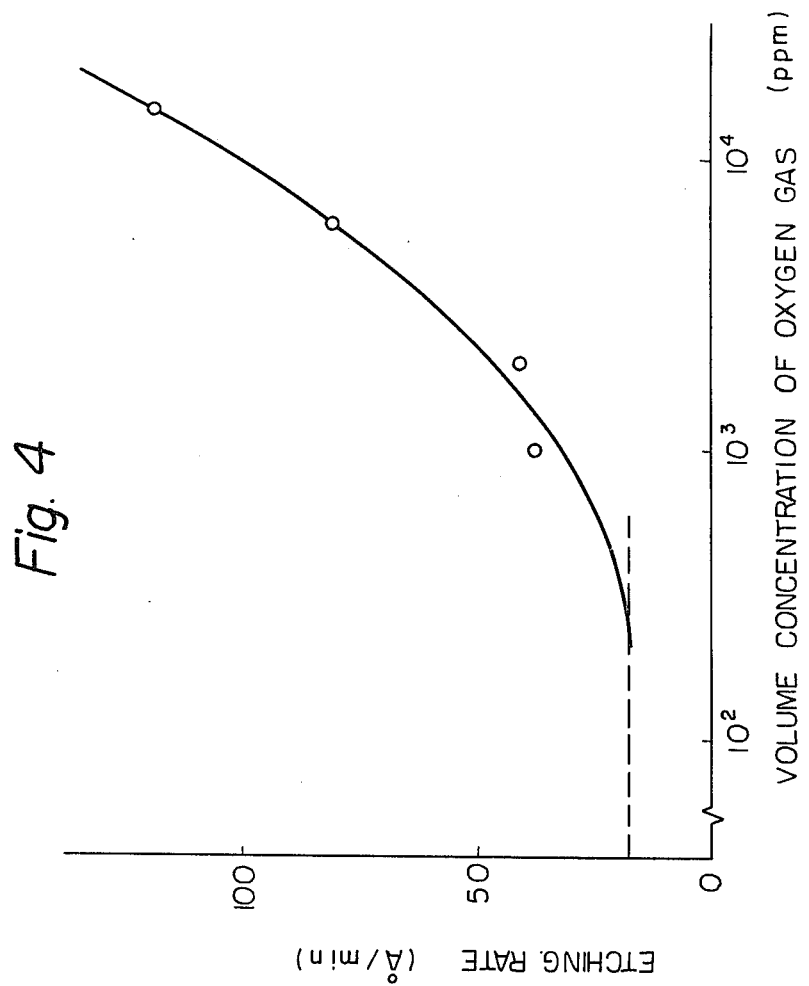

METHOD FOR FORMING AN INSULATING FILM LAYER OF SILICON OXYNITRIDE ON A SEMICONDUCTOR SUBSTRATE SURFACE

BACKGROUND OF THE INVENTION

1. Field of the Invention

The present invention relates to a method for forming an insulating film layer on a semiconductor substrate surface. More particularly, the present invention relates to a method for forming an insulating film layer, which exhibits an excellent stability in electrical properties and a high degree of density, on a surface of a semiconductor substrate useful for the production of integrated circuits.

2. Description of the Prior Art

In the production of semiconductor devices, it is known that a portion of the semiconductor surface, in which a PN junction is exposed to an ambient atmosphere, is coated with an insulating film layer in order to prevent changes in the electrical properties of the semiconductor device with the lapse of time and to enhance the reliability of the semiconductor device. In the production of MISFET (metal insulator semiconductor field effect transistor) or MIS type integrated circuits, it is also known that a gate insulating film layer is formed in the semiconductor device, so as to introduce an inversion layer channel into the device. Generally speaking, in the conventional MISFET and MIS type integrated circuits, the semiconductor substrate, the insulating film layer and the metal gate electrode respectively consist essentially of silicon (Si), silicon oxide ($SiO_2$) and aluminum (Al). However, the above-mentioned structure of the conventional metal insulator semiconductor device exhibits a disadvantage in that an application of a field of about $10^6$V/cm onto the insulating film layer at a temperature of about 200° C. results in a remarkable fluctuation of a gate threshold voltage. This disadvantageous phenomenon may be due to the fact that the drift effect of impurity ions contained in the $SiO_2$ insulating film layer or the structural defects of the $SiO_2$ insulating film layer per se cause the creation of a capture level of carriers, and the creation of the capture level of carriers results in a remarkable fluctuation in the space charge distribution in the surface layer of the semiconductor device. It is clear that the fluctuation in the space charge distribution is influenced most remarkably by the structural defects in the interface between the Si substrate and the insulating film layer ($SiO_2$). The structural defects are remarkably created when the insulating film layer ($SiO_2$) is formed by thermally oxidizing the surface layer of the Si substrate. This thermal oxidization process tends to permit the impurity ions, such as alkali metal ions, to be contaminated in the oxidized silicon film layer. In order to eliminate the above-mentioned defects from the conventional insulating film layer, an attempt was made to provide an insulating film layer by way of a chemical vapor deposition or sputtering. However, all of the previous attempts failed to reduce the structural defects in the interface between the Si substrate and the $SiO_2$ layer to a level lower than that of the thermal oxidation.

Furthermore, it is known that when the surface of the Si substrate is thermally oxidized in an extremely clean atmosphere, the resultant $SiO_2$ film layer exhibits very little structural defects in a level, in terms of surface charge density, of $10^{11}$/cm$^2$ or less. However, the interface between the Si substrate and the $SiO_2$ film layer still exhibits structural defects due to excessive silicon ions. Accordingly, it has been strongly desired to eliminate the above-mentioned defects from the interface between the Si substrate and the $SiO_2$ film layer.

On the other hand, recently, the increase in density of the integrated circuits is accompanied with a tendency to decrease the thickness of the gate insulating film layer in the semiconductor device. When a thinned insulating film layer is used, it is important that the resultant semiconductor device exhibits an excellent stability in electrical properties.

As a method for decreasing the variation in the electrical properties of the semiconductor device, it was attempted to provide a gate insulating film layer consisting of a silicon oxide film formed on a silicon substrate and a phospho-silicate glass (PSG) film formed on the silicon oxide film. However, in the case where the PSG film has a high concentration of phosphorus, an application of a high field onto the gate insulating film layer results in polarization of the gate insulating film layer. This polarization causes the potential of the semiconductor surface to be undesirably fluctuated. Also, it was found that the reduction in the thickness of the silicon oxide film causes the operation of the resultant N channel enhancement type field effect transistor to be more difficult due to the diffusion of donor impurities from the polysilicon gate film into the silicon substrate.

In another method, it was tried to utilize a silicon nitride film or aluminum oxide film as a gate insulating film layer. However, since the above-mentioned film layers are provided by means of chemical vapor deposition, structural defects are locally created in the interface between the silicon substrate and the insulating film layer. These structural defects cause the electrical properties of the semiconductor device to be unstable.

Moreover, it was attempted to utilize a silicon oxynitride film layer the properties of which are intermediate between those of the silicon oxide film layer and the silicon nitride film layer, as the gate insulating film layer. For example, the conventional silicon oxynitride film layer was produced by bringing a mixed gas containing monosilane ($SiH_4$) gas, ammonia ($NH_3$) gas and carbon dioxide ($CO_2$) gas into contact with a surface of a silicon substrate heated at a temperature of from 700° to 1000° C. so as to react the monosilane with the ammonia and carbon dioxide in vapor phase. However, the insulating film layer produced by the above-mentioned chemical vapor deposition sometimes exhibits structural defects in the interface between the silicon substrate and the insulating film layer. Otherwise, it is sometimes difficult to produce a silicon oxynitride film layer having an even structure and composition. The above-mentioned structural defects or the structural unevenness cause the electrical properties of the semiconductor device to be unstable.

SUMMARY OF THE INVENTION

An object of the present invention is to provide a method for forming an insulating film layer on a surface of a semiconductor substrate without creating structural defects between the semiconductor substrate and the insulating film layer.

Another object of the present invention is to provide a method for forming an insulating film layer having a high structural density on a surface of a semiconductor substrate.

Still another object of the present invention is to provide a method for evenly forming an insulating film layer consisting of silicon oxynitride on a surface of a semiconductor substrate consisting of silicon.

The above-mentioned objects can be attained by the method of the present invention which comprises bringing a surface of a silicon substrate into contact with an ammonia gas atmosphere containing an oxygen-containing substance gas in a volume concentration, in terms of molecular oxygen, of from $10^2$ to $10^4$ ppm at an elevated temperature, to convert the surface portion of the silicon substrate into an insulating film layer consisting of silicon oxynitride.

In the method of the present invention, it is important that the surface portion of the silicon substrate is directly converted into a silicon oxynitride insulating film layer.

BRIEF DESCRIPTION OF THE DRAWINGS

The features and advantages of the method of the present invention will be exemplified and more fully explained in the following description with reference to the accompanying drawings, in which:

FIG. 4 shows etch rate for oxygen concentration.

In the method of the present invention, the ammonia gas atmosphere contains an oxygen-containing substance gas in a volume concentration, in terms of molecular oxygen, of from $10^2$ to $10^4$ ppm, preferably, from $10^2$ to $10^3$ ppm.

If the concentration of the oxygen-containing substance gas is more than $10^4$ ppm in terms of molecular oxygen, the resultant insulating film layer will consist essentially of silicon oxide which exhibits a refractive index of 1.48. If the concentration of the oxygen-containing substance gas is less than $10^2$ ppm in terms of molecular oxygen, the resultant insulating film layer will consist essentially of silicon nitride which exhibits a refractive index of 1.95. Accordingly, in order to convert the surface portion of the silicon substrate into an insulating film layer consisting of silicon oxynitride which exhibits a refractive index of from about 1.5 to about 1.8, it is important that the volume concentration of the oxygen-containing substance gas is in a range of from $10^2$ to $10^4$ ppm in terms of molecular oxygen.

The oxygen-containing substance gas may, for example, be oxygen gas, carbon dioxide gas, carbon monooxide gas, nitrogen monoxide gas, nitrogen dioxide gas, water vapor and mixtures of two or more of these gases.

The contact of the silicon substrate surface with the ammonia gas atmosphere is carried out at an elevated temperature, preferably, of from 900° to 1300° C., for 1 to 1000 minutes. Also, it is preferable that the ammonia gas atmosphere is adjusted to a pressure of from 10 to $10^{-5}$ atm. Usually, before applying the method of the present invention, the surface of the silicon substrate is preferably cleaned up by any conventional cleaning operation, for example, a chemical etching operation.

The cleaned silicon substrate is, preferably, preliminarily heated to the same temperature as that at which the reaction of the silicon substrate with an ammonia gas atmosphere containing the oxygen-containing substance gas is carried out, in an inert gas atmosphere. The inert gas may be argon gas, helium gas, nitrogen gas or a mixture of two or more of the above-mentioned gases. After the preliminary heating, the inert gas atmosphere is replaced with an ammonia gas atmosphere containing the oxygen-containing substance gas.

Figure 1:
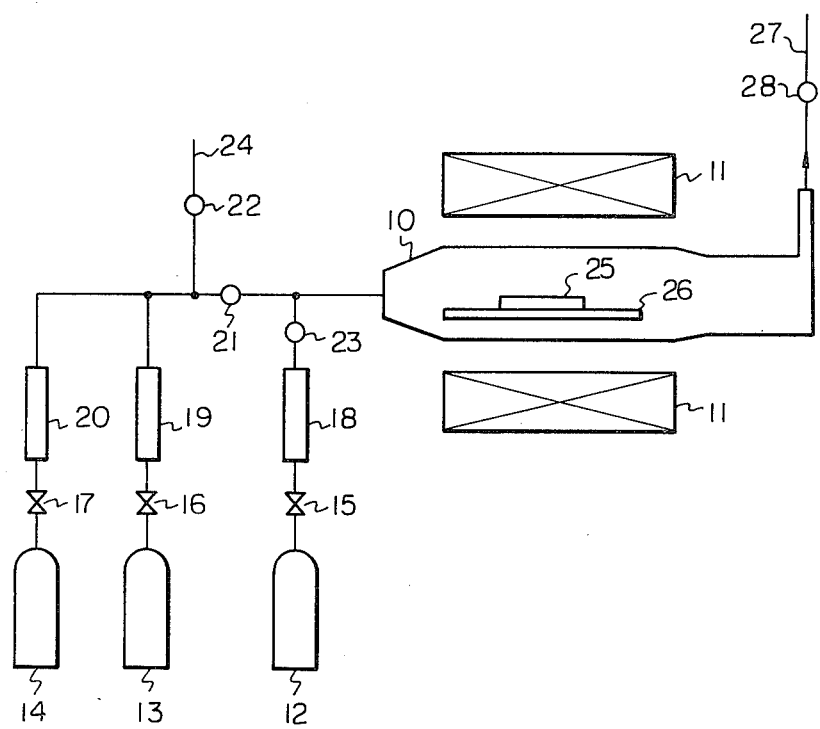
FIG. 1 is an explanatory view of an apparatus for carrying out the method of the present invention.

Referring to FIG. 1 which explanatorily shows an apparatus for effecting the method of the present invention, a quartz reaction tube 10 is placed in an electric heating furnace 11. The quartz reaction tube 10 is connected to an inert gas supply source 12 through a valve 23, a mass flow meter 18 and a pressure regulator 15; to an ammonia gas supply source 13 through a valve 21, a mass flow meter 19 and a pressure regulator 16; and to an oxygen-containing substance gas supply source 14 through the valve 21, a mass flow meter 20 and a pressure regulator 17. The sources 13 and 14 are connected to a discharge line 24 through a valve 22. The quartz reaction tube 10 is connected to another discharge line 27 through a valve 28.

Before carrying out the method of the present invention, it is preferable that the air in the quartz reaction tube 10 be replaced with an inert gas fed from the inert gas supply source 12. In this case, the pressure and the flow rate of the inert gas are controlled respectively by means of the pressure regulator 15 and the mass flow meter 18. The inert gas atmosphere in the quartz reaction tube 10 is heated to a predetermined temperature in a range of from 900° to 1300° C. A silicon substrate 25 which has been cleaned by means of a chemical etching, for instance is placed on a quartz holder 26, and charged into the quartz reaction tube 10. The silicon substrate 25 is heated in the inert gas atmosphere by means of the heating furnace 11 until the temperature of the silicon substrate reaches the above-mentioned temperature and is maintained at this constant temperature for a predetermined time. Thereafter, the valve 23 is closed and the valve 21 is opened so that the ammonia gas and the oxygen-containing substance gas are fed respectively from the ammonia gas supply source 13 and the oxygen-containing substance gas source 14, into the quartz reaction tube 10.

The amounts of the ammonia gas and the oxygen-containing substance gas to be fed into the quartz reaction tube 10 are controlled respectively by means of the pressure regulator 16 and the mass flow meter 19 and the pressure regulator 17 and the mass flow meter 20, so that the content of the oxygen-containing substance gas in the ammonia gas atmosphere in the reaction tube 10 is maintained at a predetermined level in a range of from $10^2$ to $10^4$ ppm in terms of molecular oxygen. The silicon substrate 25 is exposed to the ammonia gas atmosphere containing the oxygen-containing substance gas under the above-mentioned conditions for a predetermined time, for example, 1 to 10000 minutes, so that the surface portion of the silicon substrate 25 is converted into a silicon oxynitride film layer having a desired thickness, for example, 20 to 1000 angstroms. After the completion of the conversion, the valve 21 is closed and the valve 23 is opened so that the inert gas is fed into the reaction tube 10 and the ammonia gas atmosphere containing the oxygen-containing substance gas is discharged from the reaction tube 10 through the valve 28 and the discharge line 27. Thereafter, the silicon substrate 25 is removed from the reaction tube 10.

When the silicon oxynitride film layer, prepared in accordance with the method of the present invention, is used as a gate insulating film layer of a MIS-type field effect transistor, the threshold voltage for forming a channel is stably maintained at a constant value which corresponds to the thickness of the silicon oxynitride film layer. Also, the silicon oxynitride film layer produced by the method of the present invention is useful for coating exposed junction regions of semiconductor devices and can maintain the electrical properties of the semiconductor devices constant.

EXAMPLE

By using an apparatus as shown in FIG. 1, a number of experiments for converting a surface portion of a silicon substrate into an insulating film layer were carried out. In each of the experiments, the ammonia gas atmosphere in the quartz reaction tube contained oxygen gas in a volume concentration within a range of from $10^2$ to $10^4$ ppm, and maintained at a temperature of 1100° C. for 30 minutes. The silicon substrate was exposed to the ammonia gas—oxygen gas atmosphere for 60 minutes. The thickness and the refractive index of the resultant insulating film layer were measured.

Figure 2:
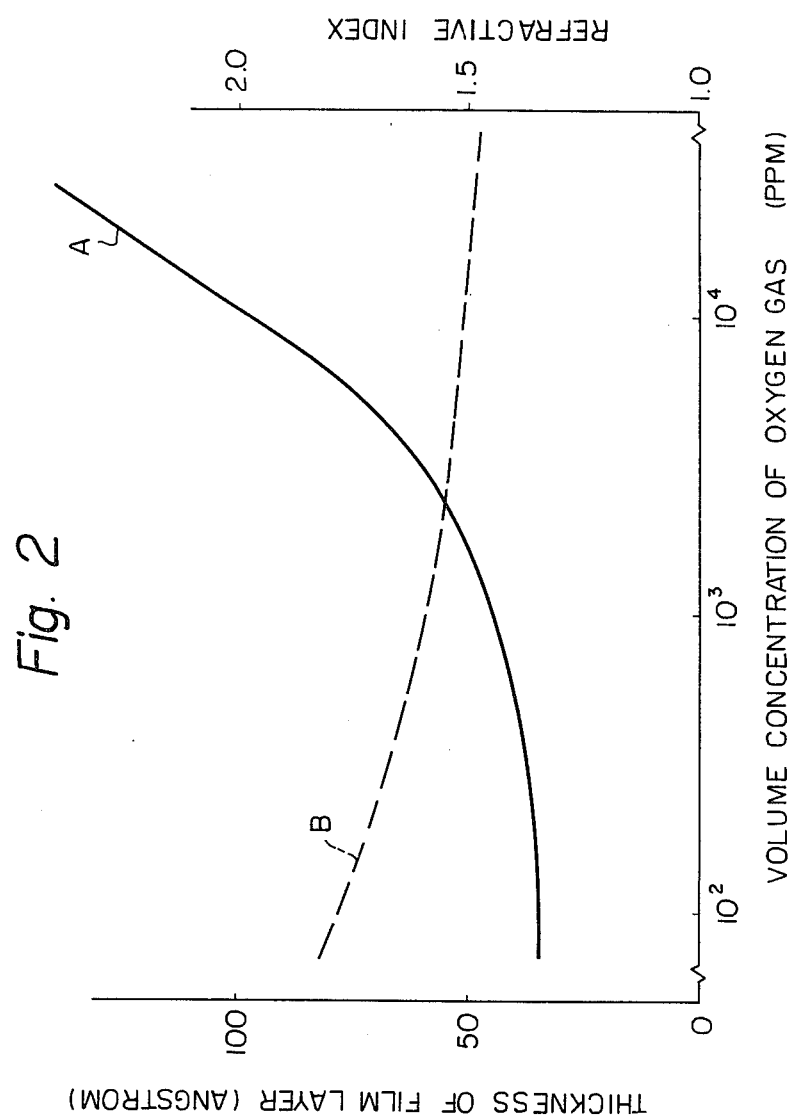
FIG. 2 is a graph showing a relationship between the volume concentration of molecular oxygen in an ammonia atmosphere and the thickness of the resultant insulating film layer and a relationship between the above-mentioned concentration and the refractive index of the resultant insulating film layer.

In FIG. 2, Curve A shows a relationship between the concentration of the oxygen gas and the thickness of the resultant insulating film layer and Curve B shows a relationship between the above-mentioned concentration and the refractive index of the insulating film layer.

Curve B clearly shows that when the volume concentration of the oxygen gas is in a range of from $10^2$ to $10^4$ ppm, the resultant insulating film layer exhibited a refractive index within a range of from about 1.5 to about 1.8 and, therefore, consisted of silicon oxynitride. Curve A shows that the greater the degree of concentration by volume of the oxygen gas in the ammonia gas atmosphere, the thicker the resultant insulating film layer.

Further, it was found that the number of structural defects created in the interface between the silicon substrate and the insulating silicon oxynitride film layer was $10^{11}/cm^2$, whereas the number of structural defects created in the interface between a silicon substrate and an insulating silicon nitride ($Si_3N_4$) film layer produced by the afore-mentioned conventional method, was $10^{12}/cm^2$ or more.

Figure 3:
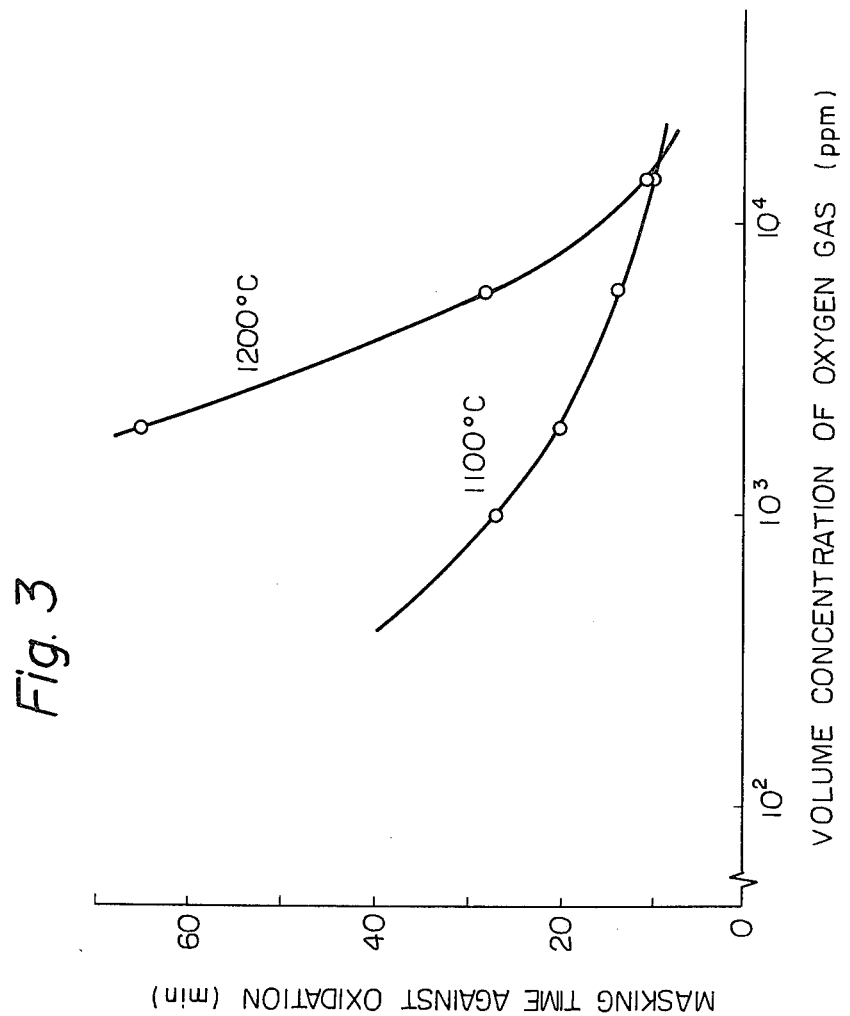
FIG. 3 shows masking time for oxygen concentraton.

The silicon substrates each masked by a silicon oxynitride film layer, prepared as mentioned above, and other silicon substrates each masked by another silicon oxynitride film layer, prepared by the same method as that mentioned above, except that the temperature of the ammonia gas atmospheres were respectively maintained at temperatures of 1100° C. and 1200° C. for 30 minutes, were exposed to an oxygen atmosphere having a temperature of 1000° C. and wetted with water vapor by bubbling water thereinto at a temperature of 80° C. In each case of the masked silicon substrates, the masking time against oxidation, which term refers to the time from a stage at which the exposure of the masked silicon substrate to the oxygen atmosphere is started to a stage at which the oxidation of the masked silicon substrate occurs, was measured. The results of the measurements are shown in FIG. 3. FIG. 3 shows that the masking time against oxidation of the masked silicon substrate decreases with an increase of the concentration by volume of oxygen gas in the ammonia gas atmosphere. However, even in the case where the volume concentration of oxygen gas in the ammonia gas atmosphere is $10^4$ ppm, the masking time against oxidation is about 10 minutes, which is longer than in the case where the silicon substrate is masked with a silicon oxide film layer.

Moreover, the insulating film layers prepared on the silicon substrates by the method mentioned above were subjected to an etching test in a mixture of 10 parts of $NH_4F$ and 1 part of HF. In each case of the insulating film layers, the etching rate in angstrom per minute (Å/min) thereof was measured. The result is shown in FIG. 4. From FIG. 4, it is clear that the etching rate increases with an increase in the concentration of oxygen in the ammonia gas atmosphere. Also, the etching rate of the insulating film layer prepared in the ammonia gas atmosphere containing $10^4$ ppm of oxygen gas is similar to but less than that of a silicon oxide insulating film layer. Furthermore, the etching rate of the insulating film layer prepared in the ammonia gas atmosphere containing oxygen gas in a concentration close to $10^2$ ppm, is similar to that of a silicon nitride insulating film layer. From the above-mentioned facts it is evident that the insulating film layers consist of a silicon oxynitride which exhibits a proper etching rate and a high masking effect against oxidation.

What is claimed is:

1. A method for forming an insulating film on a surface of a silicon semiconductor substrate with a relatively low density of surface defects between the substrate and insulating film, comprising directly converting a surface portion of the silicon substrate into an insulating film layer comprising silicon oxynitride by bringing a cleaned surface of said silicon substrate into contact with an atmosphere consisting essentially of an ammonia gas and an oxygen-containing substance gas at an elevated temperature, said oxygen-containing substance gas having a volume concentration, in terms of molecular oxygen, of from $10^2$ to $10^4$ ppm.

2. A method as claimed in claim 1, wherein said oxygen-containing substance gas is selected from the group consisting of oxygen gas, carbon dioxide gas, carbon monoxide gas, nitrogen monoxide, nitrogen dioxide, water vapor and mixtures of two or more of said gases.

3. A method as claimed in claim 1, wherein said contact of said silicon substrate surface with the ammonia gas atmosphere is carried out at a temperature of from 900° to 1300° C.

4. The method of claim 1 comprising providing said molecular oxygen to have volume concentration in the range from $10^2$ to $10^3$ ppm, and performing said directly converting said silicon substrate to oxynitride to have a density of surface defects of less than $10^{12}/cm^2$ and a refractive index in the range from 1.5 to 1.8.

5. A method as claimed in claim 1, 2, 3 or 4 wherein said reaction is carried out under a pressure of from 10 to $10^{-5}$ atm.

6. A method as claimed in claim 1, 2 or 3 wherein said silicon oxynitride insulating film has a refractive index of from about 1.5 to about 1.8.

7. The method of claim 1, 2, 3 or 4, comprising contacting said semiconductor substrate surface with said gas for a period between 1 to 1000 minutes at a pressure from 10 to $10^{-5}$ atm.

8. The method of claim 1, 2, 3 or 4, comprising forming said insulating film layer to have a thickness in the range from 35 to 100 angstroms.

9. The method of claim 1, 2, 3 or 4, comprising forming said insulating film layer on said semiconductor substrate surface to have a density of structural defects of as little as $10^{11}/cm^2$.

10. The method of claim 1, 2, 3 or 4, comprising forming said insulating film layer to effectively mask against an oxidizing atmosphere for a period in the range from 10 minutes up to at least 70 minutes.

11. The method of claim 1, 2, 3 or 4, comprising forming said insulating film layer to have an etching rate in a mixture of 10 parts of $NH_4F$ to 1 part HF of 100 angstroms per minute or less.

12. The method of claim 4, said oxygen-containing substance gas being selected from the group consisting of oxygen gas, carbon dioxide gas, carbon monoxide gas, nitrogen monoxide, nitrogen dioxide, water vapor and mixtures of two or more of the said gases.

13. The method of claim 4 or 12, wherein said contact of said silicon substrate surface with the ammonia gas atmosphere is carried out at a temperature of from 900° to 1300° C.

* * * * *

UNITED STATES PATENT AND TRADEMARK OFFICE
CERTIFICATE OF CORRECTION

PATENT NO. : 4,282,270
DATED : 4 August 1981
INVENTOR(S) : TAKAO NOZAKI et al.

It is certified that error appears in the above—identified patent and that said Letters Patent is hereby corrected as shown below:

Front page, [73] Assignee, should be --Fujitsu Limited, Kawasaki-Shi, Japan --.

[56], Other Publications, in the Poponiak et al. citation, "$Si_xO_yN_2$" should be --$Si_xO_yN_z$--, and "Anodinitridization" should be --Anodnitrization--;

In the Brown et al. citation, "$Si_xO_yN_2$" should be --$Si_xO_yN_z$--;

[57] Abstract, line 5, "a gas com-" should be --an oxygen---;
line 6, delete "prising".

Col. 1, line 35, "C." should be --C--.
Col. 2, line 45, "C." should be --C--.
Col. 3, line 59, "C." should be --C--.
Col. 4, line 33, after "instance" insert --,--.
Col. 5, lines 20, 52 (2 occurrences) & 54, "C." should be --C--;
line 31, " ppm" should be --ppm--;
line 44, "afore-mentioned" should be --aforementioned--.
Col. 6, line 52, "1.5to" should be --1.5 to--;
line 53, after "4" insert --,--;
line 56, after "3" insert --,--;
line 61, "to" should be --and--.

Signed and Sealed this

Twenty-third Day of March 1982

[SEAL]

Attest:

GERALD J. MOSSINGHOFF

Attesting Officer    Commissioner of Patents and Trademarks